United States Patent
Worledge et al.

(10) Patent No.: US 12,020,736 B2
(45) Date of Patent: Jun. 25, 2024

(54) SPIN-ORBIT-TORQUE MAGNETORESISTIVE RANDOM-ACCESS MEMORY ARRAY

(71) Applicant: International Business Machines Corporation, Armonk, NY (US)

(72) Inventors: Daniel Worledge, San Jose, CA (US); Pouya Hashemi, Purchase, NY (US); John Kenneth DeBrosse, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 235 days.

(21) Appl. No.: 17/401,394

(22) Filed: Aug. 13, 2021

(65) Prior Publication Data

US 2023/0049812 A1 Feb. 16, 2023

(51) Int. Cl.
*G11C 11/16* (2006.01)
*G11C 11/00* (2006.01)
(Continued)

(52) U.S. Cl.
CPC ........ *G11C 11/161* (2013.01); *G11C 11/1655* (2013.01); *G11C 11/1657* (2013.01); *G11C 11/1673* (2013.01); *G11C 11/1675* (2013.01); *H10B 61/10* (2023.02); *H10B 61/22* (2023.02); *H10N 50/10* (2023.02); *H10N 50/85* (2023.02); *H10N 52/80* (2023.02)

(58) Field of Classification Search
CPC .............. G11C 11/161; G11C 11/1655; G11C 11/1657; G11C 11/1673; G11C 11/1675
USPC ........................................................ 365/158
See application file for complete search history.

(56) References Cited

U.S. PATENT DOCUMENTS

| 1,063,430 A | 6/1913 | Grahl |
|---|---|---|
| 6,750,540 B2 | 6/2004 | Kim |

(Continued)

FOREIGN PATENT DOCUMENTS

| CN | 109643567 A | 4/2019 |
|---|---|---|
| CN | 110660435 A | 1/2020 |

(Continued)

OTHER PUBLICATIONS

IBM Appendix P, "List of patent and patent applications treated as related", Aug. 13, 2021, 2 pages.

(Continued)

*Primary Examiner* — Ly D Pham
(74) *Attorney, Agent, or Firm* — David K. Mattheis

(57) ABSTRACT

A spin-orbit torque magnetoresistive random-access memory device formed by forming an array of transistors, where a column of the array includes a source line contacting the source contact of each transistor of the column, forming a spin-orbit-torque (SOT) line contacting the drain contacts of the transistors of the row, and forming an array of unit cells, each unit cell including a spin-orbit-torque (SOT) magnetoresistive random access memory (MRAM) cell stack disposed above and in electrical contact with the SOT line, where the SOT-MRAM cell stack includes a free layer, a tunnel junction layer, and a reference layer, a diode structure above and in electrical contact with the SOT-MRAM cell stack, an upper electrode disposed above and in electrical contact with the diode structure.

25 Claims, 14 Drawing Sheets

(51) Int. Cl.
  *G11C 11/18*  (2006.01)
  *H10B 61/00*  (2023.01)
  *H10N 50/10*  (2023.01)
  *H10N 50/85*  (2023.01)
  *H10N 52/80*  (2023.01)

(56) References Cited

U.S. PATENT DOCUMENTS

| | | | |
|---|---|---|---|
| 8,916,872 B1* | 12/2014 | Tran | H01L 21/26506 257/E29.328 |
| 9,269,415 B1* | 2/2016 | Liu | H10N 50/10 |
| 9,570,137 B2* | 2/2017 | Sugiyama | G11C 11/165 |
| 9,830,968 B2 | 11/2017 | Shimomura | |
| 10,193,061 B2 | 1/2019 | Shiokawa | |
| 10,205,088 B2 | 2/2019 | Sasaki | |
| 10,319,901 B2 | 6/2019 | Sasaki | |
| 10,374,151 B2 | 8/2019 | Komura | |
| 10,381,060 B2 | 8/2019 | Kan | |
| 10,396,276 B2 | 8/2019 | Sasaki | |
| 10,418,545 B2 | 9/2019 | Sasaki | |
| 10,438,641 B2 | 10/2019 | Sasaki | |
| 10,439,130 B2 | 10/2019 | Sasaki | |
| 10,454,023 B2 | 10/2019 | Tang | |
| 10,468,456 B2 | 11/2019 | Jacob | |
| 10,490,249 B2 | 11/2019 | Sasaki | |
| 10,490,601 B2 | 11/2019 | Braganca | |
| 10,529,914 B2 | 1/2020 | Kakinuma | |
| 10,580,470 B2 | 3/2020 | Shiokawa | |
| 10,593,388 B2 | 3/2020 | Shiokawa | |
| 10,593,868 B2 | 3/2020 | Shiokawa | |
| 10,622,048 B2 | 4/2020 | Shiokawa | |
| 10,644,228 B2 | 5/2020 | Sasaki | |
| 10,651,366 B2 | 5/2020 | Shiokawa | |
| 10,665,375 B2 | 5/2020 | Ota | |
| 10,741,318 B2 | 8/2020 | Ishitani | |
| 10,748,563 B2 | 8/2020 | Sasaki | |
| 10,756,262 B2 | 8/2020 | Komura | |
| 10,762,941 B2 | 9/2020 | Shiokawa | |
| 10,763,430 B2 | 9/2020 | Shiokawa | |
| 10,770,214 B2 | 9/2020 | Shiokawa | |
| 10,797,231 B2 | 10/2020 | Sasaki | |
| 10,840,002 B2 | 11/2020 | Sasaki | |
| 10,854,258 B2 | 12/2020 | Shiokawa | |
| 10,861,523 B2 | 12/2020 | Sasaki | |
| 10,892,400 B2 | 1/2021 | Noh | |
| 10,902,987 B2 | 1/2021 | Sasaki | |
| 10,910,554 B2 | 2/2021 | Sasaki | |
| 10,943,631 B2 | 3/2021 | Sasaki | |
| 10,944,045 B2 | 3/2021 | Sasaki | |
| 10,971,229 B2 | 4/2021 | Jaiswal | |
| 10,971,293 B2 | 4/2021 | Sasaki | |
| 10,998,493 B2 | 5/2021 | Komura | |
| 11,004,479 B2 | 5/2021 | Bhargava | |
| 11,004,490 B2 | 5/2021 | Sakhare | |
| 11,289,538 B2 | 3/2022 | Ying | |
| 11,793,001 B2 | 10/2023 | Evarts | |
| 2008/0186759 A1* | 8/2008 | Shimizu | G11C 11/16 365/158 |
| 2014/0254245 A1* | 9/2014 | Tadepalli | G11C 11/1659 365/148 |
| 2015/0109849 A1* | 4/2015 | Tsai | G11C 13/0069 365/148 |
| 2015/0171324 A1* | 6/2015 | Mikawa | H10N 70/801 257/4 |
| 2015/0263069 A1 | 9/2015 | Jo | |
| 2017/0092842 A1 | 3/2017 | Khalili Amiri | |
| 2017/0117027 A1 | 4/2017 | Braganca | |
| 2018/0061467 A1* | 3/2018 | Kan | G11C 11/1659 |
| 2020/0098822 A1 | 3/2020 | Toh | |
| 2020/0235288 A1* | 7/2020 | Ikegawa | G11C 11/161 |
| 2020/0235289 A1 | 7/2020 | Alam | |
| 2020/0350364 A1 | 11/2020 | Wan | |
| 2021/0020695 A1 | 1/2021 | Bak | |
| 2021/0134339 A1* | 5/2021 | Song | G11C 11/161 |
| 2021/0257543 A1 | 8/2021 | Heng | |
| 2021/0375342 A1* | 12/2021 | Sun | H10N 50/01 |
| 2022/0199685 A1 | 6/2022 | Wan | |
| 2022/0199686 A1 | 6/2022 | Wan | |
| 2022/0223649 A1 | 7/2022 | Wan | |
| 2022/0223650 A1 | 7/2022 | Katine | |
| 2023/0046923 A1 | 2/2023 | Evarts | |
| 2023/0049812 A1 | 2/2023 | Worledge | |
| 2023/0050152 A1 | 2/2023 | Hashemi | |
| 2023/0065109 A1 | 3/2023 | Dellinger | |
| 2023/0065198 A1 | 3/2023 | Young | |
| 2023/0089984 A1 | 3/2023 | Wu | |

FOREIGN PATENT DOCUMENTS

| | | |
|---|---|---|
| CN | 111740011 A | 10/2020 |
| CN | 112420096 A | 2/2021 |
| WO | 2020131893 A2 | 6/2020 |
| WO | 20200131893 W | 6/2020 |
| WO | 2020192201 A1 | 10/2020 |

OTHER PUBLICATIONS

Kim et al., "Multilevel Spin-Orbit Torque MRAMs," in IEEE Transactions on Electron Devices, vol. 62, No. 2, pp. 561-568, Feb. 2015, doi: 10.1109/TED.2014.2377721.
Seo et al., "Area-Efficient SOT-MRAM With a Schottky Diode", IEEE Electron Device Letters, vol. 37, No. 8, Aug. 2016, 4 pps.
U.S. Appl. No. 17/401,383, filed Aug. 13, 2021.
U.S. Appl. No. 17/401,415, filed Aug. 13, 2021.
International Search Report and Written Opinion dated Oct. 26, 2022 from International Application No. PCT/IB2022/056619 dated Jul. 19, 2022.

* cited by examiner

125

100

SPIN-ORBIT-TORQUE MAGNETORESISTIVE RANDOM-ACCESS MEMORY ARRAY

BACKGROUND

The disclosure relates generally to magnetoresistive random-access memory (MRAM) structures. The disclosure relates particularly to arrays of spin-orbit torque MRAM cells; each cell integrated with a diode.

MRAM is a type of solid state, non-volatile memory that uses tunneling magnetoresistance (TMR) to store information. MRAM is made up of an electrically connected array of magnetoresistive memory elements, referred to as magnetic tunnel junctions (MTJs). Each MTJ includes a free layer and fixed layer that each include a layer of a magnetic material, and that are separated by a non-magnetic insulating tunnel barrier. The free layer is disposed adjacent to a spin orbit torque layer, sometimes referred to as a spin Hall effect layer. The free layer has a variable magnetization direction, and the fixed layer has an invariable magnetization direction. An MTJ stores information by switching the magnetization state of the free layer. When the magnetization direction of the free layer is parallel to the magnetization direction of the fixed layer, the MTJ is in a low resistance state. Conversely, when the magnetization direction of the free layer is antiparallel to the magnetization direction of the fixed layer, the MTJ is in a high resistance state. The difference in resistance of the MTJ may be used to indicate a logical '1' or '0', thereby storing a bit of information. The TMR of an MTJ determines the difference in resistance between the high and low resistance states. A relatively high difference between the high and low resistance states facilitates read operations in the MRAM. MRAM cells can be formed as a vertical stack enabling device design options for increasing device memory cell element density while maintaining or even reducing the scale of devices.

Spin-orbit-torque (SOT) MRAM cells include a spin-orbit torque, or spin-Hall-effect (SHE), layer in contact with the magnetic tunnel junction (MTJ) structure of the MRAM. The SHE is typically a heavy conductive metal, such as platinum or tantalum. Current is passed through the SHE layer, but not through the MTJ structure, to write to the cell and current is passed through the MTJ to read the cell. Since high voltage write energies are not passed though the MTJ of the MRAM cell, SOT MRAM tend to be more reliable and have a longer lifecycle. Less energy is used in writing the SOT MRAM, as the write energy does not pass through the MTJ. Passing the write current through the SHE layer, and not through the MTJ structure, also yields fewer writing errors, and higher writing speeds—further reducing the energy needed per write operation.

Control of read and write functions for a standard SOT-MRAM cell typically includes a first transistor controlling the read current through the cell and a second transistor controlling the write current through the SHE line of the cell. The relevant circuit die area for such SOT-MRAM cells therefore includes the SOT-MRAM cell and the two control transistors. Across billions of device MRAM cells the additional space required by the second transistor consumes significant die space.

SUMMARY

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later.

In one aspect, a spin-orbit torque magnetoresistive random-access memory device formed by forming an array of transistors, where a column of the array includes a source line contacting the source contact of each transistor of the column, forming a spin-orbit-torque (SOT) line contacting the drain contacts of the transistors of the row, and forming an array of unit cells, each unit cell including a spin-orbit-torque (SOT) magnetoresistive random access memory (MRAM) cell stack disposed above and in electrical contact with the SOT line, where the SOT-MRAM cell stack includes a free layer, a tunnel junction layer, and a reference layer, a diode structure above and in electrical contact with the SOT-MRAM cell stack, an upper electrode disposed above and in electrical contact with the diode structure. This SOT-MRAM structure provides an increased die density for the SOT cells, it also reduces the pattern complexity of the SOT-MRAM cell array through the use of line patterns along the rows of the array. The disclosed embodiments are compatible with current FinFET and Nanosheet technologies as well as with any low-temperature fabrication technologies.

In one aspect, a MRAM (magnetoresistive random-access memory) structure including an array of spin-orbit-torque (SOT) magnetoresistive-random-access-memory (MRAM) cells, where a SOT-MRAM cell of the array includes a magnetic tunnel junction (MTJ), a diode disposed above the MTJ, and a single transistor, a column of the array includes a source line contacting the source contact of each transistor of the column, the source line disposed at a first metal layer of the MRAM structure, and a row of the array includes a SOT line contacting the drain contacts of each transistor of the row, the SOT line disposed at a second metal layer of the MRAM structure. This SOT-MRAM structure provides an increased die density for the SOT cells, it also reduces the pattern complexity of the SOT-MRAM cell array through the use of line patterns along the rows of the array. The disclosed embodiments are compatible with current FinFET and Nanosheet technologies as well as with any low-temperature fabrication technologies.

In one aspect, a MRAM (magnetoresistive random-access memory) structure including an array of spin-orbit-torque (SOT) magnetoresistive-random-access-memory (MRAM) cells, where a SOT-MRAM cell of the array includes a magnetic tunnel junction (MTJ), a diode disposed above the MTJ, and a single transistor, a column of the array includes a source line contacting the source contact of each transistor of the column, the source line disposed at a first metal layer of the MRAM structure, the column includes a bit line in contact with each diode of the column, the bit line disposed at a third metal layer of the MRAM structure, and a row of the array includes a SOT line contacting the drain contacts of each transistor of the row, the SOT line disposed at a second metal layer of the MRAM structure. This SOT-MRAM structure provides an increased die density for the SOT cells, it also reduces the pattern complexity of the SOT-MRAM cell array through the use of line patterns along the rows of the array. The disclosed embodiments are compatible with current FinFET and Nanosheet technologies as well as with any low-temperature fabrication technologies.

In one aspect, an MRAM (magnetoresistive random-access memory) structure including an array of spin-orbit-torque (SOT) magnetoresistive-random-access-memory (MRAM) cells, where a SOT-MRAM cell of the array includes a magnetic tunnel junction (MTJ), a diode disposed above the MTJ, and a single transistor, a column of the array includes a source line contacting the source contact of each transistor of the column, the source line disposed at a first metal layer of the MRAM structure, a row of the array includes a SOT line contacting the drain contacts of each transistor of the row, the SOT line disposed at second metal layer of the MRAM structure, and the row of the array includes a word line in contact with the gates of each transistor of the row. This SOT-MRAM structure provides an increased die density for the SOT cells, it also reduces the pattern complexity of the SOT-MRAM cell array through the use of line patterns along the rows of the array. The disclosed embodiments are compatible with current FinFET and Nanosheet technologies as well as with any low-temperature fabrication technologies.

In one aspect, an MRAM (magnetoresistive random-access memory) structure includes an array of spin-orbit-torque (SOT) magnetoresistive-random-access-memory (MRAM) cells, where an SOT-MRAM cell of the array includes an magnetic tunnel junction (MTJ), a diode disposed above the MTJ, and a single transistor, a column of the array includes a source line contacting the source contact of each transistor of the column, the source line disposed at a first metal layer of the MRAM structure, the column of the array includes a bit line in contact with each diode of the column, the bit line disposed at a third metal layer of the MRAM structure, a row of the array includes a SOT line contacting the drain contacts of each transistor of the row, the SOT line disposed at a second metal layer of the MRAM structure, and the row of the array includes a word line in contact with the gates of each transistor of the row. This SOT-MRAM structure provides an increased die density for the SOT cells, it also reduces the pattern complexity of the SOT-MRAM cell array through the use of line patterns along the rows of the array. The disclosed embodiments are compatible with current FinFET and Nanosheet technologies as well as with any low-temperature fabrication technologies.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Figure 1:
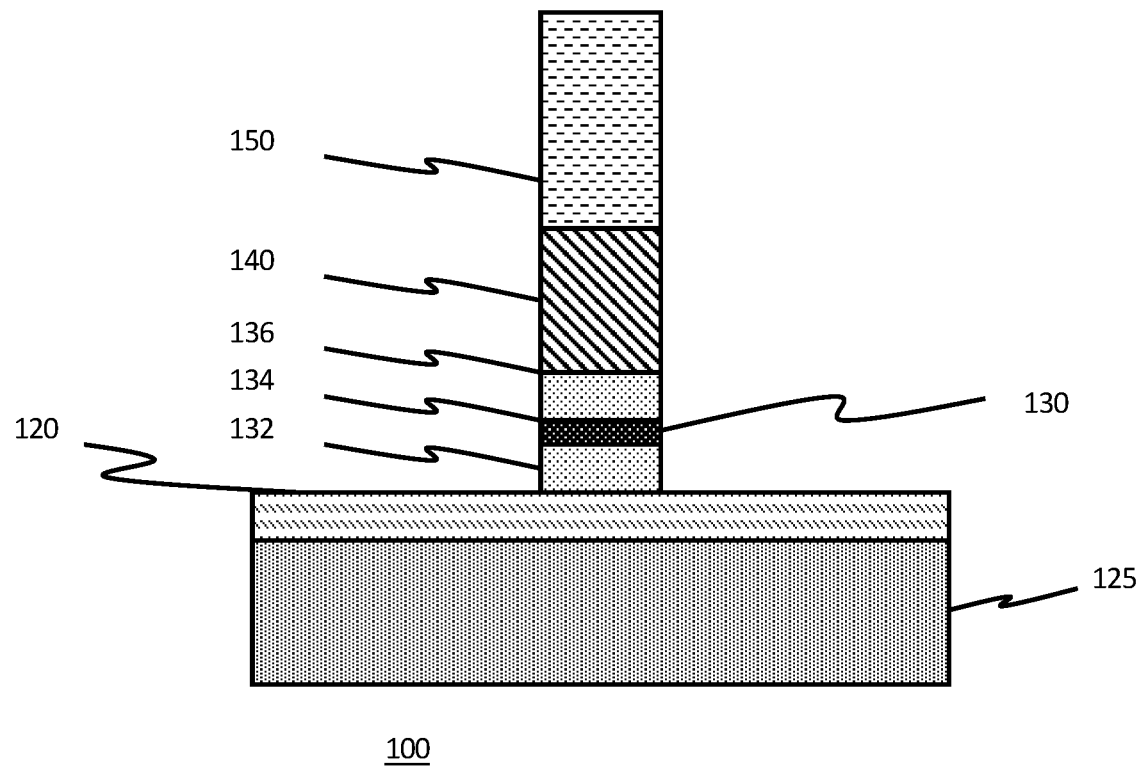
FIG. 1 provides a cross-sectional view of a step in the fabrication of a semiconductor device, according to an embodiment of the invention. The figure illustrates the MTJ including a top electrode and upper hard mask, as well as an SHE rail layer in contact with a bottom electrode and device transistor contact.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein can be interpreted accordingly. In addition, it should be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Spin-transfer torque (STT) magnetoresistive random-access memory (MRAM) passes current through the magnetic tunnel junction of the memory cell during each of the read and write operations. High write energies can reduce the longevity of the devices by degrading the device materials. Spin-orbit torque (SOT) MRAM devices resolve this issue by only passing relatively low read operation energies directly through the magnetic tunnel junction of the MRAM cell. The SOT, or spin Hall-effect (SHE) plate of the SOT MRAM cell must have a cross sectional area equal to or greater than the rest of the MRAM cell stack to effectively alter the free layer and write to the cell. Writing to a SOT MRAM cell does not require passing energy through the SOT MRAM cell stack. Typical SOT-MRAM cells structures include two transistors, one associated with writing a value to the cell and one associated with reading the value of the cell. Structures including two transistors require additional die area for each cell. Disclosed embodiments incorporate a cylindrical diode around the SOT-MRAM cell stack and enable the control of both read and write operations for the cell through a single transistor.

Disclosed embodiments provide for arrays of SOT-MRAM cells disposed in rows and columns. Each unit cell SOT-MRAM includes a single transistor disposed below the SHE rail of the SOT-MRAM cell, the drain contact of the transistor in electrical contact with the SHE rail, the MTJ of the cell in contact with the SHE rail, a diode disposed above the MTJ and in contact with an upper electrode of the SOT-MRAM cell, and an upper electrode inContact with the diode and a read line for the SOT-MRAM cell.

The use of a single transistor for each cell enables higher cell densities and supports additional integration of the device elements. The incorporation of a diode formed between the MTJ and upper electrode of the SOT-MRAM cell stack enable the control of read and write functions for the SOT-MRAM cell using a single transistor. The wiring pattern for arrays of SOT-MRAM cells includes transistor source lines in disposed beneath and parallel to the columns of SOT-MRAM cells of the array, in contact with the source contact of each transistor of the column, word lines, disposed in contact below and parallel to rows of SOT-MRAM cells of the array as well as in contact with the gate contacts of the transistors of the unit cells of the row, the SHE (SOT) rail of the SOT-MRAM cells of the row disposed parallel to the word line and in contact with the drain contacts of the transistors of the row, and a bit line, or read line, disposed above and in electrical contact with the diode of the cell. The bit lines for the array are disposed parallel to the source lines and columns of SOT-MRAM cells of the array.

In an embodiment, a vertical SOT MRAM cell stack is etched from material layers deposited upon an underlying semiconductor device. Disclosed devices include rows of SOT-MRAM cells, each cell in contact with the drain contact of a front-end-of-line (FEOL) transistor (not shown) by way of a common SOT line, or SHE rail, shared across the row of SOT-MRAM cells As shown in FIG. 1, device 100 includes SHE layer 120 is disposed upon bottom electrodes (not shown) and dielectric material 125. In an embodiment, SHE layer 120 consists of one or more heavy, conductive metals such as $\beta$-Ta, $\beta$-W, $Cu_xPt_{1-x}$, $Cu_{1-x}Ta_x$, $Pd_xPt_{1-x}$, $Au_xPt_{1-x}$, Pt, $Bi_2Se_3$, $WTe_2$, $PtTe_2$, $TaS_2$, $Pt_xRh_{1-x}$, or any metallic alloy with average atomic weight above 80, or similar conductive metals and combinations thereof. In an embodiment, the SHE layer 120 has a thickness of between about 1 nm and about 50 nm. In an embodiment, SHE layer 120 consists of tungsten. In an embodiment, SHE layer 120 consists of multiple layers of heavy metals such as Ta and Pt, deposited in succession. Deposition of the SHE layer 120 occurs by deposition processes including, e.g., chemical vapor deposition (CVD), physical vapor deposition (PVD), atomic layer deposition (ALD), or similar processes.

FIG. 1 illustrates the device after the deposition of a succession of material layers. The succession of layers form the SOT-MRAM cells including a magnetic tunnel junction (MTJ) an upper electrode, and an upper hard mask. As shown in FIG. 1, the layers for the MTJ stacks include a simplistically depicted MTJ 130 made of a free magnetic layer 132 (a layer having a switchable magnetic dipole moment), a tunnel barrier layer 134, and a reference magnetic layer 136 (a layer having a fixed magnetic dipole moment). The SOT-MRAM cell stack further includes upper electrode 140, and hard mask layer 150. In this embodiment, the MTJ 130 includes a seed layer (not shown) having free layer 132 grown thereon. The seed layer may include, for example, tantalum (Ta) or tantalum magnesium (TaMg) in some embodiments. The free layer 132 may include cobalt-iron-boron (CoFeB), for example. The respective layers may be formed by PVD. Next, a tunnel barrier layer 134 is formed on free layer 132. The tunnel barrier layer 134 may include a non-magnetic insulating material such as magnesium oxide (MgO). In an embodiment, tunnel barrier layer 134 is between about 0.3 nm and about 2 nm in thickness. Following the formation of the tunnel barrier layer 134, the reference layer 136 is formed on top of the tunnel barrier layer 134. The reference layer 136 may include, for example one or more interfacial layers, or spacers, and ruthenium, cobalt, palladium, tantalum, iron, boron, cobalt-platinum (CoPt) or cobalt-palladium (CoPd), in multilayers or a mixture. In an embodiment, reference layer 136 is between about 3 nm and about 10 nm in thickness. The respective layers may be formed by PVD. The free layer 132 and the reference layer 136 have perpendicular magnetic anisotropy.

Upper electrode layer 140 may comprise TiN, TaN, W, or other conductive metals or alloys. Hard mask layer 150 may comprise SiN, $SiO_x$, $Si_xB_yC_zN_t$, etc. In an embodiment, the hard mask layer 150 consists of TaN or TiN deposited by CVD or PVD to a thickness of between about 20 nm and about 60 nm. In an embodiment, hard mask layer 150 consists of a nitride, oxide, an oxide-nitride bilayer, or another suitable material. In some embodiments, the hard mask layer 150 may include an oxide such as silicon oxide (SiO), a nitride such as silicon nitride (SiN), an oxynitride such as silicon oxynitride (SiON), combinations thereof, etc. In some embodiments, the hard mask layer 150 is a silicon nitride such as $Si_3N_4$.

FIG. 1 illustrates device 100 after deposition of and patterned etching of the MTJ 130, upper electrode 140, and dielectric hard mask 150, from a stack of layers of the relevant materials sequentially deposited across the surface of the device die. Patterned lithography may be used to mask the stacked layers prior to the application of selective etching such as reactive ion beam etching, to remove the unmasked portions of the layers. Selective etching stops at the upper surface of the SHE rail layer 120.

Figure 2:
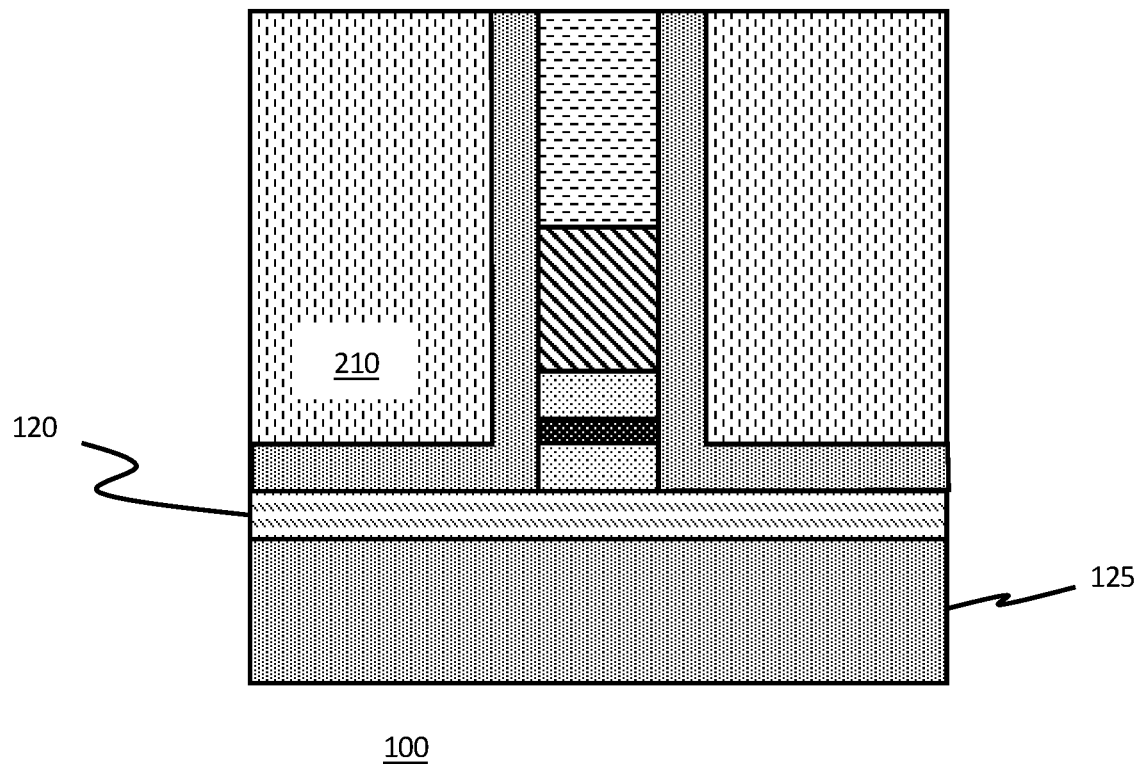
FIG. 2 provides a cross-sectional view of a step in the fabrication of a semiconductor device, according to an embodiment of the invention. The figure illustrates the device after encapsulation of the MTJ stack, upper electrode and hard mask.

FIG. 2 illustrates device 100 after the deposition of an encapsulating dielectric material layer 210, such as SiN, $SiO_x$, $Si_xB_yC_zN_t$, etc., around the SOT-MRAM cell stack, followed by CMP processes to recess the dielectric material to the upper surface of the hard mask layer 150. The CMP processes yielding a polished upper surface in preparation for the next fabrication steps.

Figure 3:
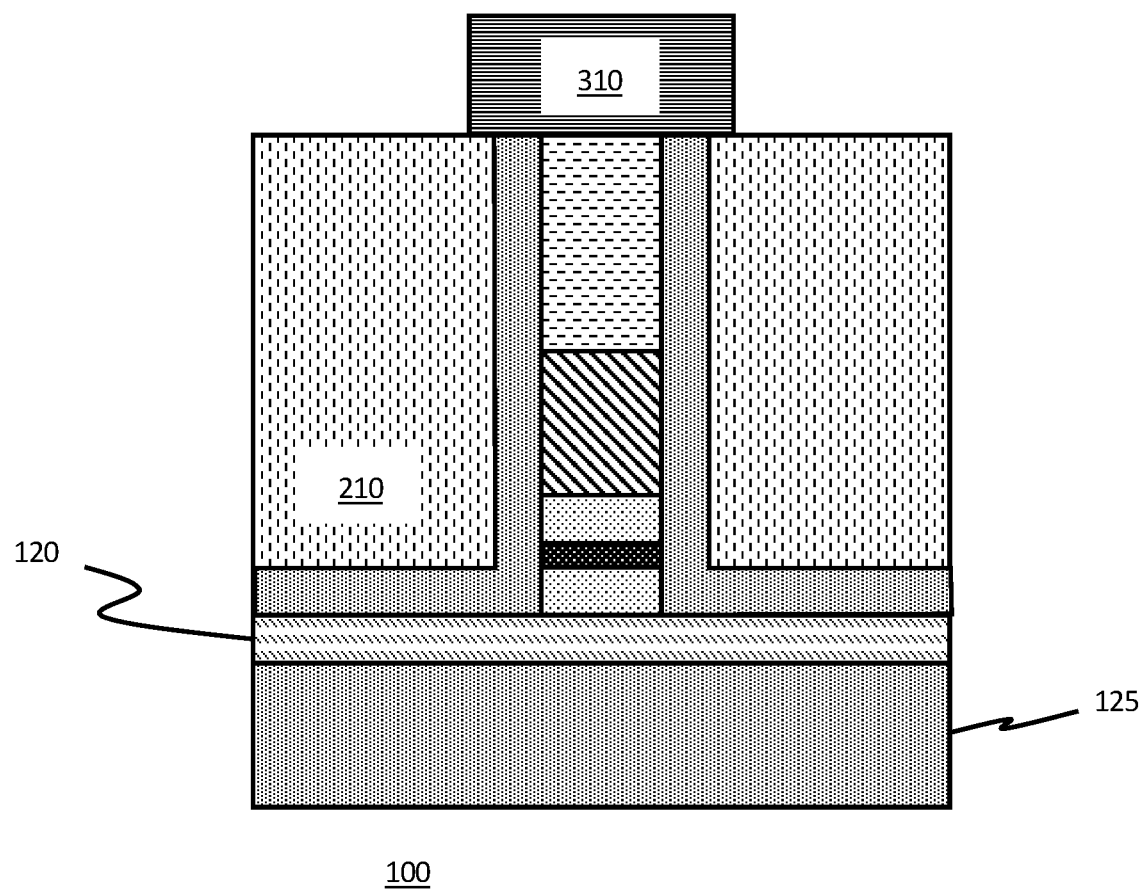
FIG. 3 provides a cross-sectional view of a step in the fabrication of a semiconductor device, according to an embodiment of the invention. The figure illustrates the device after the addition of a patterned hard mask.

FIG. 3 illustrates device 100 after the deposition, lithographic masking and selective removal of a SHE rail mask 310, such as an organic planarization layer (OPL), or a hard mask layer (TiN, TaN, etc.). Patterned mask 310 provides the desired cross-section mask for the SHE rail formed from SHE layer 120.

Figure 4:
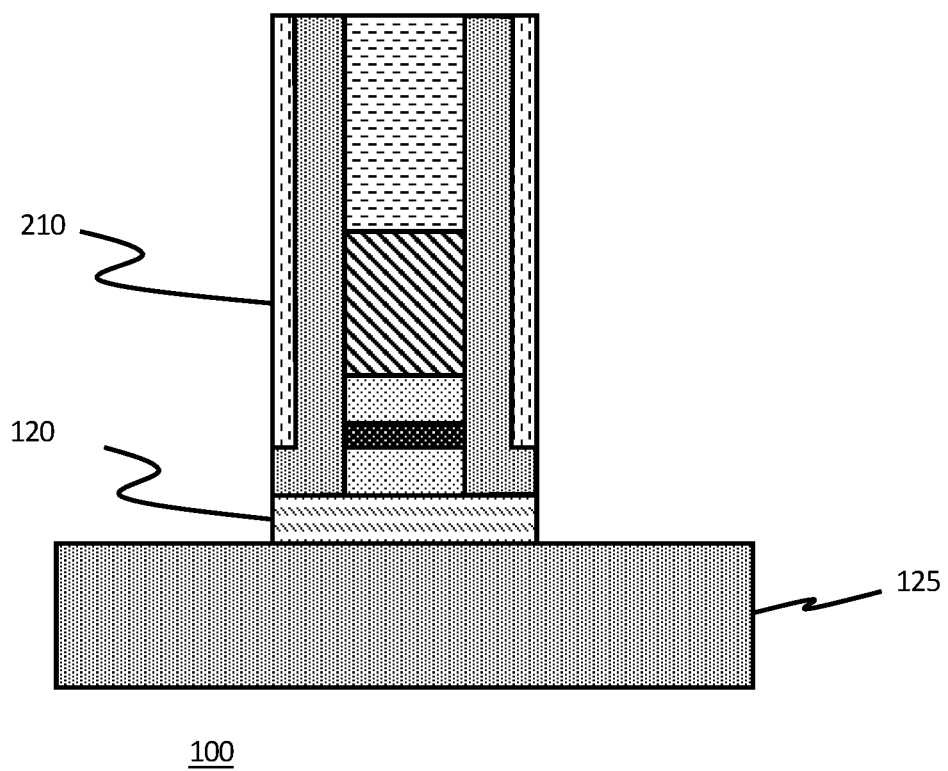
FIG. 4 provides a cross-sectional view of a step in the fabrication of a semiconductor device, according to an embodiment of the invention. The figure illustrates the device after the patterned etching of SHE rail.

FIG. 4 illustrates device 100 after selective removal of encapsulating dielectric material 210, portions of SHE layer 120, and patterned mask 310. Reactive ion etching may be used in the removal of the materials. Etching stops at dielectric layer 125 of the underlying FEOL device.

Figure 5:
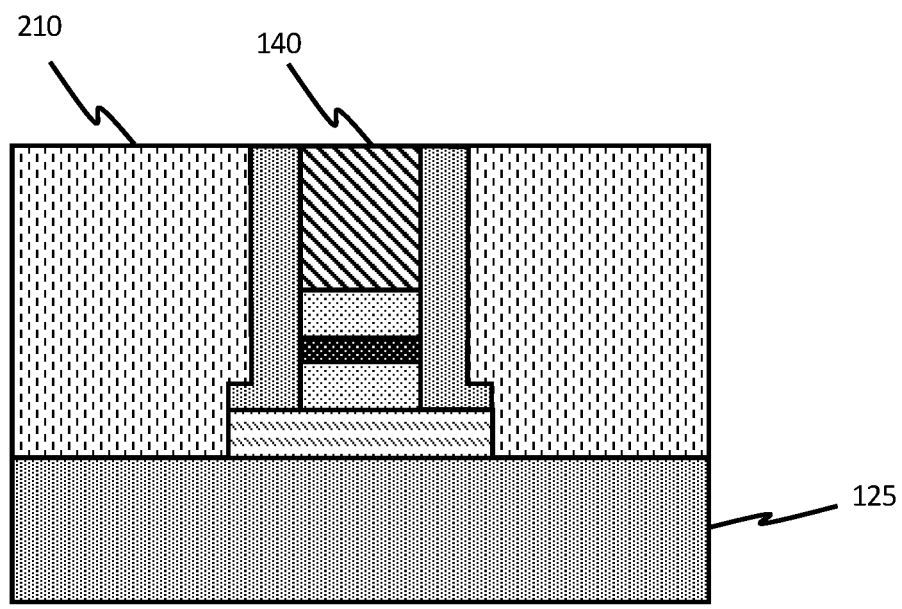
FIG. 5 provides a cross-sectional view of a step in the fabrication of a semiconductor device, according to an embodiment of the invention. The figure illustrates the device after the removal of the hard mask to expose the SOT-MRAM cell upper electrode.

FIG. 5 illustrates device 100 after refilling encapsulation dielectric 210 and CMP of hard mask 150 and protective dielectric 210 to the upper surface of upper electrode 140.

Figure 6:
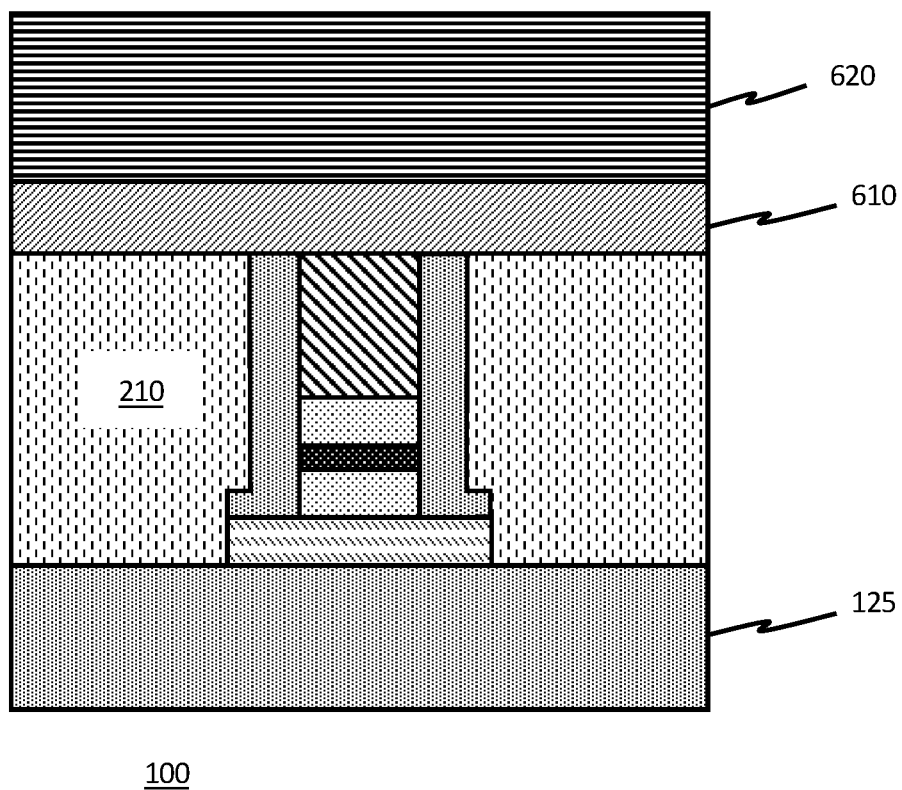
FIG. 6 provides a cross-sectional view of a step in the fabrication of a semiconductor device, according to an embodiment of the invention. The figure illustrates the device after deposition of the diode layers and diode upper electrode.

FIG. 6 illustrates device 100 after deposition of diode junction material(s) 610, such as 2D materials including WSe, SnSe2, graphene, etc., poly-Ge (P/N) (deposited at low-temperatures and laser annealed), and a sequence of W/TiOx/Ni layers forming a Schottky diode, and an upper hard mask/upper diode electrode layer 620. Formed diodes may comprise circular or square cross-sections. In an embodiment, formation of the diode through deposition of the diode junction material occurs at back-end-of-line compatible temperatures, such as temperatures below about 420C.

Figure 7:
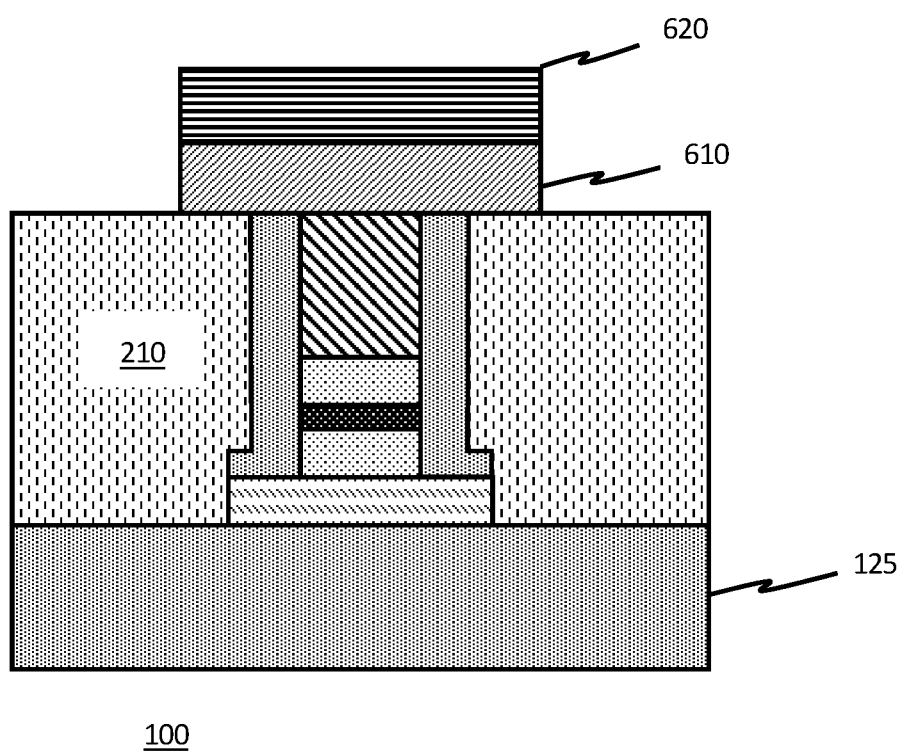
FIG. 7 provides a cross-sectional view of a step in the fabrication of a semiconductor device, according to an embodiment of the invention. The figure illustrates the device after patterned masking and selective etching to form the SOT-MRAM cell diode.

FIG. 7 illustrates device 100 following pattern masking and selective removal of diode junction material(s) 610, and upper electrode materials 620 by way of RIE, anisotropic etching, or other selective etching methods.

Figure 8:
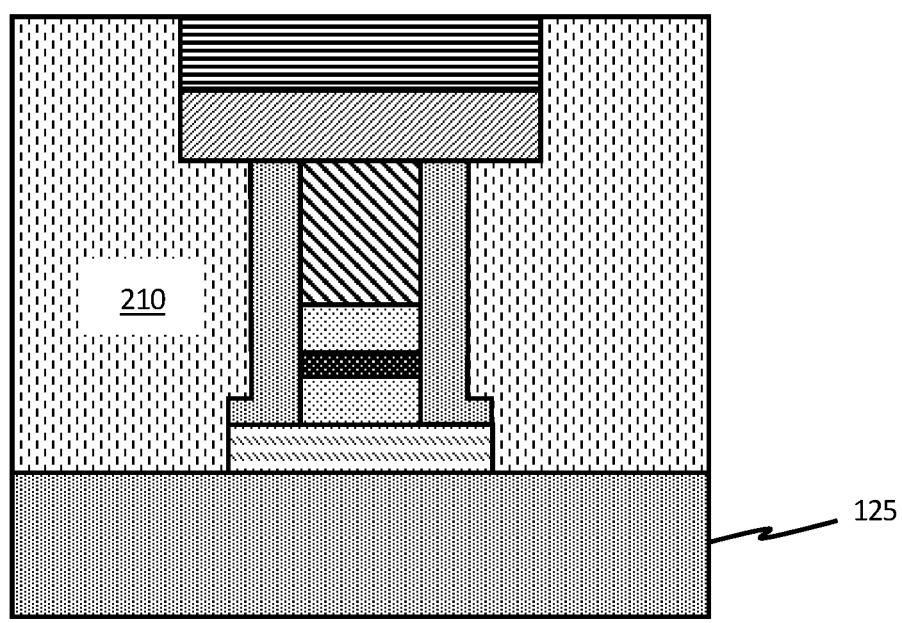
FIG. 8 provides a cross-sectional view of a step in the fabrication of a semiconductor device, according to an embodiment of the invention. The figure illustrates the device after encapsulating the diode and upper diode electrode.

FIG. 8 illustrates device 100 following encapsulation of the diode junction 610 and upper electrode 620 by a layer of dielectric material 210, such as SiOx, SiON, etc., and CMP of the encapsulating layer to the upper surface of upper electrode 620.

Figure 9:
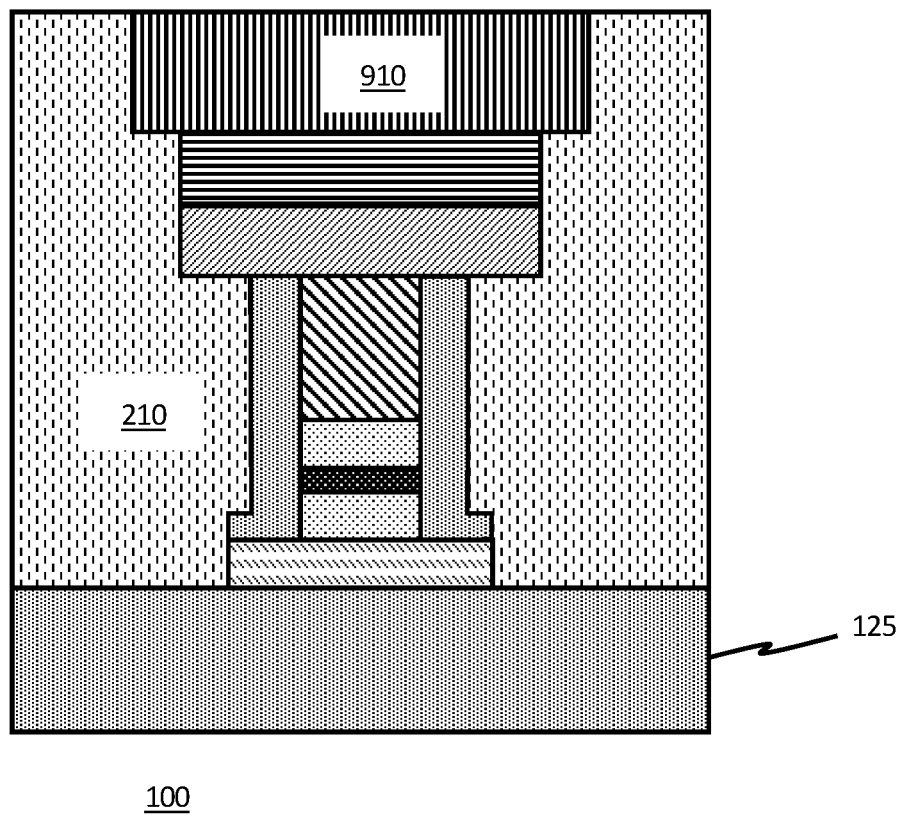
FIG. 9 provides a cross-sectional view of a step in the fabrication of a semiconductor device, according to an embodiment of the invention. The figure illustrates the device after fabrication of the SOT-MRAM bit line or read line.

FIG. 9 illustrates device 100 across a column of the array following formation of upper bit line/read line, 910. Bit line 910 may be formed through the deposition of a layer of conductive metallic electrode material followed by lithographic masking and selective removal of the electrode material to form the bit lines for the array. Each bit line corresponds to a column of SOT-MRAM cells of the array. Each bit line contacts the upper electrodes of the diodes of each SOT-MRAM cell of the column of the array.

Figure 10:
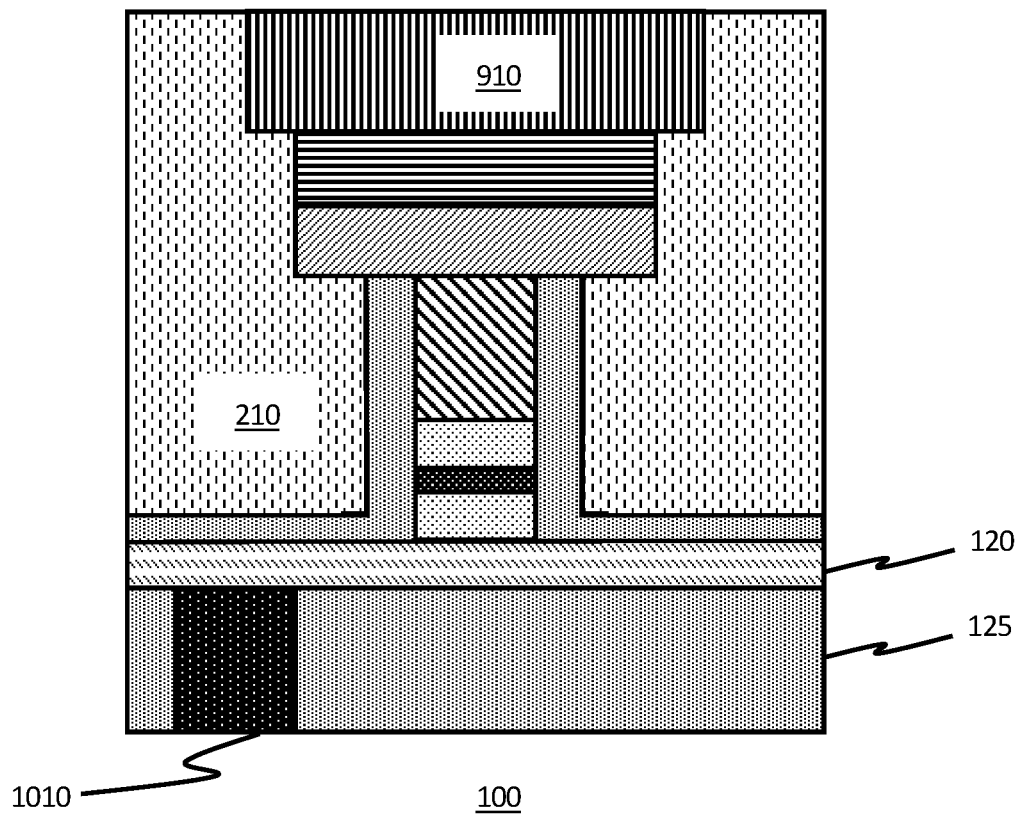
FIG. 10 provides a cross-sectional view of a step in the fabrication of a semiconductor device, according to an embodiment of the invention. The figure illustrates another view of the device after fabrication of the SOT-MRAM bit line or read line.

FIG. 10 illustrates device 100 across a row of the array following formation of upper bit line/read line, 910. As shown in the FIG., SHE rail 120 contacts drain contact 1010 of the associated FEOL transistor on the unit SOT-MRAM cell.

Figure 11:
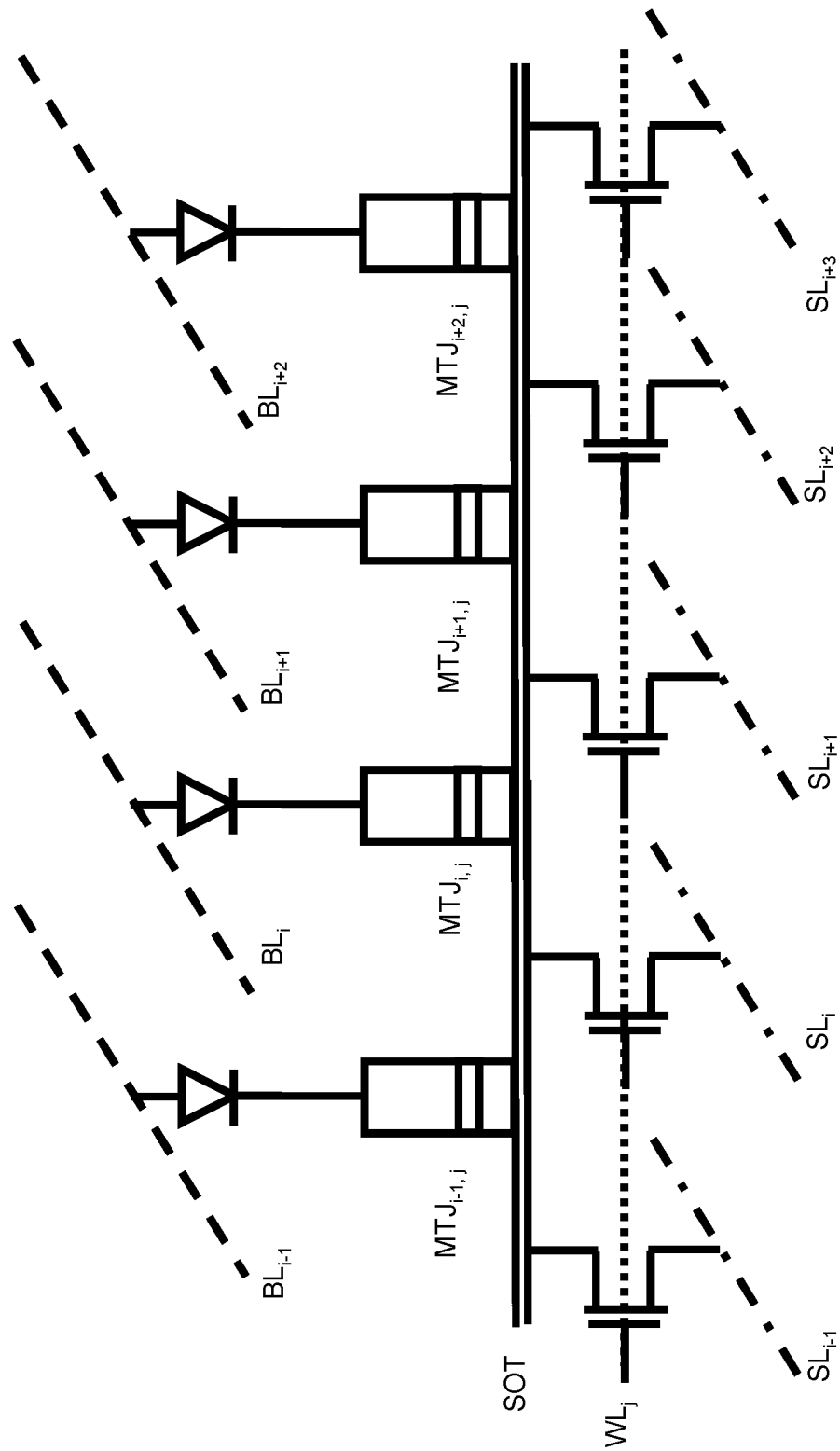
FIG. 11 provides a schematic perspective view of the array of SOT-MRAM cells.

FIG. 11 illustrates the wiring pattern for the SOT-MRAM cells of the array. As shown in the Figure, source lines ($SL_{i-1}$-$SL_{i+3}$) are disposed parallel to columns of SOT-MRAM cells and contact the source contacts of the FEOL transistors associated with the cells of the respective columns of the array. Word line $WL_i$, is disposed parallel to row i of the array and contacts the gates of the FEOL transistors of row i. Common SOT rail is disposed along row I of the array in contact with both the drains of the associated FEOL transistors and the MTJs of the SOT-MRAM cells of the row. Bit lines ($BL_{i-1}$-$BL_{i+2}$) are disposed parallel to the columns and source linse of the array, and in electrical contact with the upper diode electrodes of each SOT-MRAM cell of the respective array column.

Reading a SOT-MRAM cell comprises applying a known voltage across the diode and MTJ cell stack, between the read electrode/bit line and the ground through the FEOL transistor and measuring the current through the stack. As an example, reading the value of the SOT-MRAM cell including $MTJ_{i,j}$, includes setting $BL_i$ to 1 with all other BL set to 0, $WL_i$ is set to 1, and all SL are set to 0. Current flows from $BL_i$ through the diode and $MTJ_{i,j}$, through the SOT and the transistors to $SL_i$ and $SL_{i+1}$. The resistance of the stack is determined from the voltage and current. The resistance indicates either a cell value of "0", or "1". The presence of the forward biased diode in the SOT-MRAM cell enables current to flow from the bit line to the source line but not from the SOT or source line to the bit line.

Each cell has two write commands. A first write command applies a negative voltage across the SHE rail of the cell, between the transistor and the write electrode, this write command switches the free layer of the SOT-MRAM from a parallel state to a antiparallel state with regard to the reference layer of the stack. As an example, for SOT-MRAM cell including $MTJ_{i,j}$, this write command is executed by setting $WL_i$ to 1, biasing $SL_i+1$ ... to 1, $SL_{i-1}$, $SL_i$, to 0, and all BL to 0. Current flows from $SL_i+1$ through the transistors and SOT to $SL_i$ changing the state of $MTJ_{i,j}$ to 1. The second write command applies a positive voltage across the SHE rail of the cell, between the transistor and the write electrode, this write command switches the free layer of the SOT-MRAM from an antiparallel state to a parallel state with regard to the reference layer of the stack. As an example, for SOT-MRAM cell including $MTJ_{i,j}$, this write command is executed by setting $WL_i$ to 1, biasing $SL_i+1$ ... to 0, $SL_{i-1}$, $SL_i$, to 1, and all BL to 0. Current flows from $SL_i$ through the transistors and SOT to $SL_i+1$ changing the state of $MTJ_{i,j}$ to 0.

Incorporating a diode in the SOT-MRAM cell stack limits the direction of current flow through the stack to the direction from the read electrode, through the stack to the ground through the transistor. This limitation enables control of both write commands and the read command for the cell through a single transistor. The location, junction material, junction height and thickness, of the diode of disclosed embodiments may be altered to tune the voltage drop across the diode of the SOT-MRAM cells.

Figure 12:
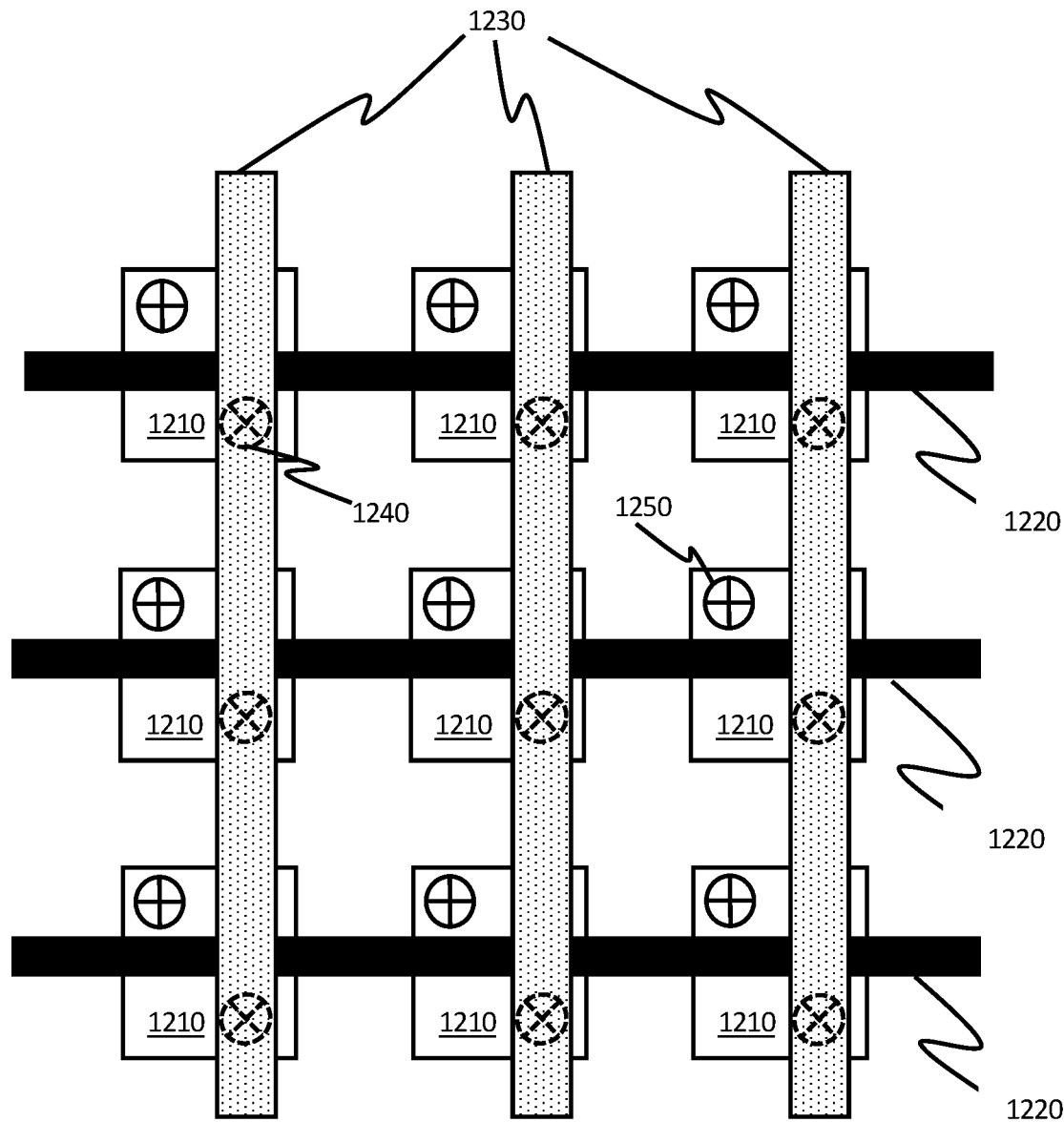
FIG. 12 provides a plan view of a step in the fabrication of a semiconductor device, according to an embodiment of the invention. The figure illustrates the device prior to the formation of the SOT line, MTJ, diode and bit lines.

FIG. 12 provides a plan view of the device 100 at an early stage of fabrication, prior to formation of the SOT rail. The figure illustrates a portion of an array of MRAM cells of a device 100. As shown in the Figure, an array of transistors 1210, are interconnected by word lines 1220 and source lines 1230. Each word line 1220 connects to the gate contacts (not shown) of the transistors 1210, in a respective row of the array. Each source line 1230 is disposed above transistors 1210, of an array column, in parallel to the columns of the array, perpendicular to and above the word lines 1220, and connected to the source contacts 1240, of the transistors 1210 of the columns. In an embodiment, source lines are formed at a first metal layer (M1) of the device 100. FIG. 12 further illustrates the location of drain contacts 1250 of transistors 1210.

Figure 13:
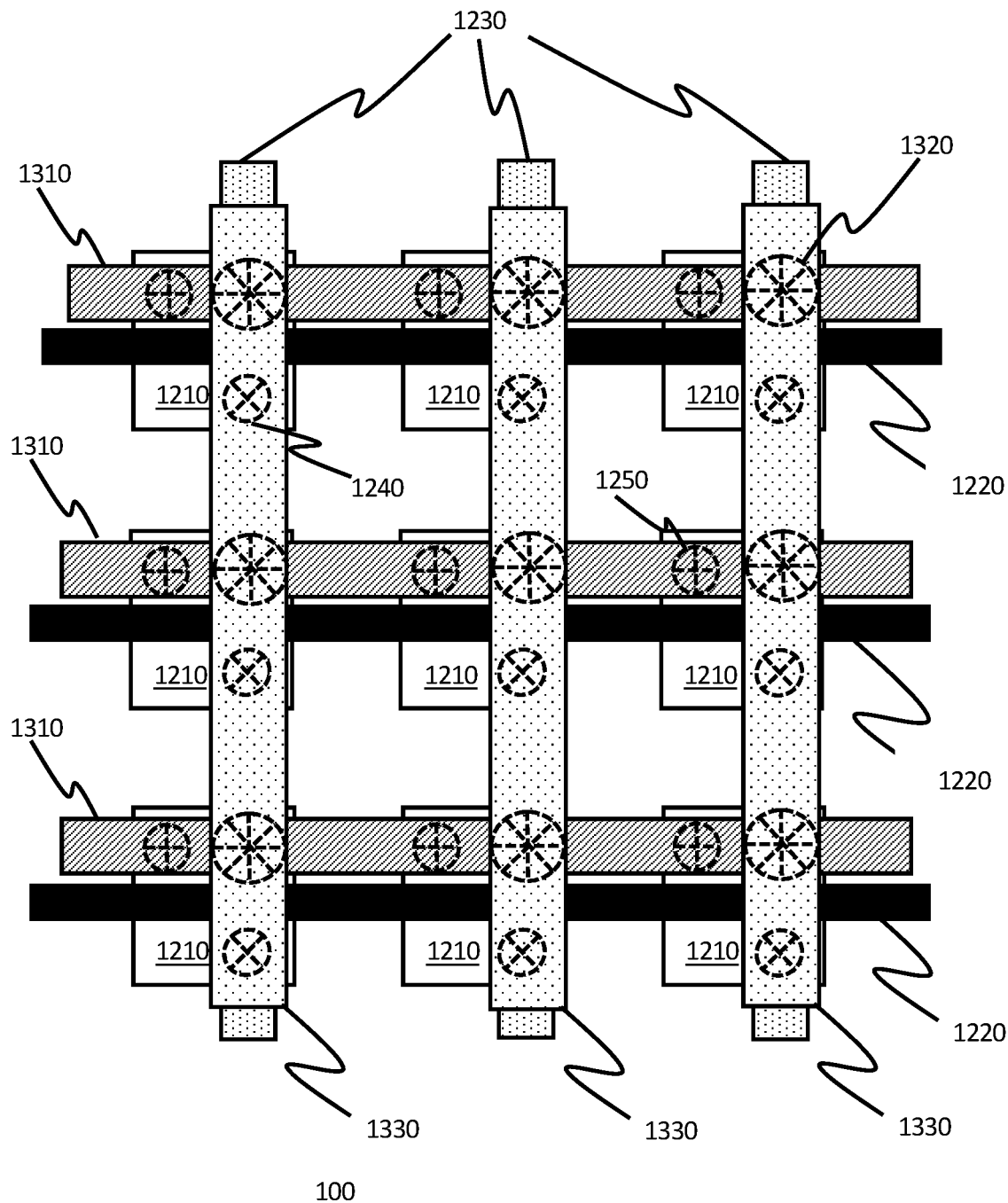
FIG. 13 provides a plan view of a step in the fabrication of a semiconductor device, according to an embodiment of the invention. The figure illustrates the device after formation of the SOT line, the MTJ and diode and the bit line.

FIG. 13 provides a plan view of device 100 at an intermediate fabrication stage. The figure illustrates a portion of an array of MRAM cells of a device 100. As shown in the FIG., SOT lines 1310 have been formed parallel to the rows of the array, above transistors 1210, and source lines 1220, and connected to the drain contacts 1250, of transistors 1210, of the rows of the array. In an embodiment, SOT lines 1310, are formed at a second metal line (M2) of the device 100. MTJ stack and diodes 1320, are disposed above and connected to the SOT rails 1310. The MTJ stack and diodes 1320 are fabricated between the M2 and a third metal layer (M3) of device 100. Bit lines 1330 are disposed parallel to the source lines, above the diodes, and connected to upper diode electrodes of diodes 1320. Each bit line 1330 is connected to the upper diode electrodes of the diodes 1320 of a respective column of the array. In an embodiment, bit lines 1330 are formed at M3 of device 100.

Figure 14:
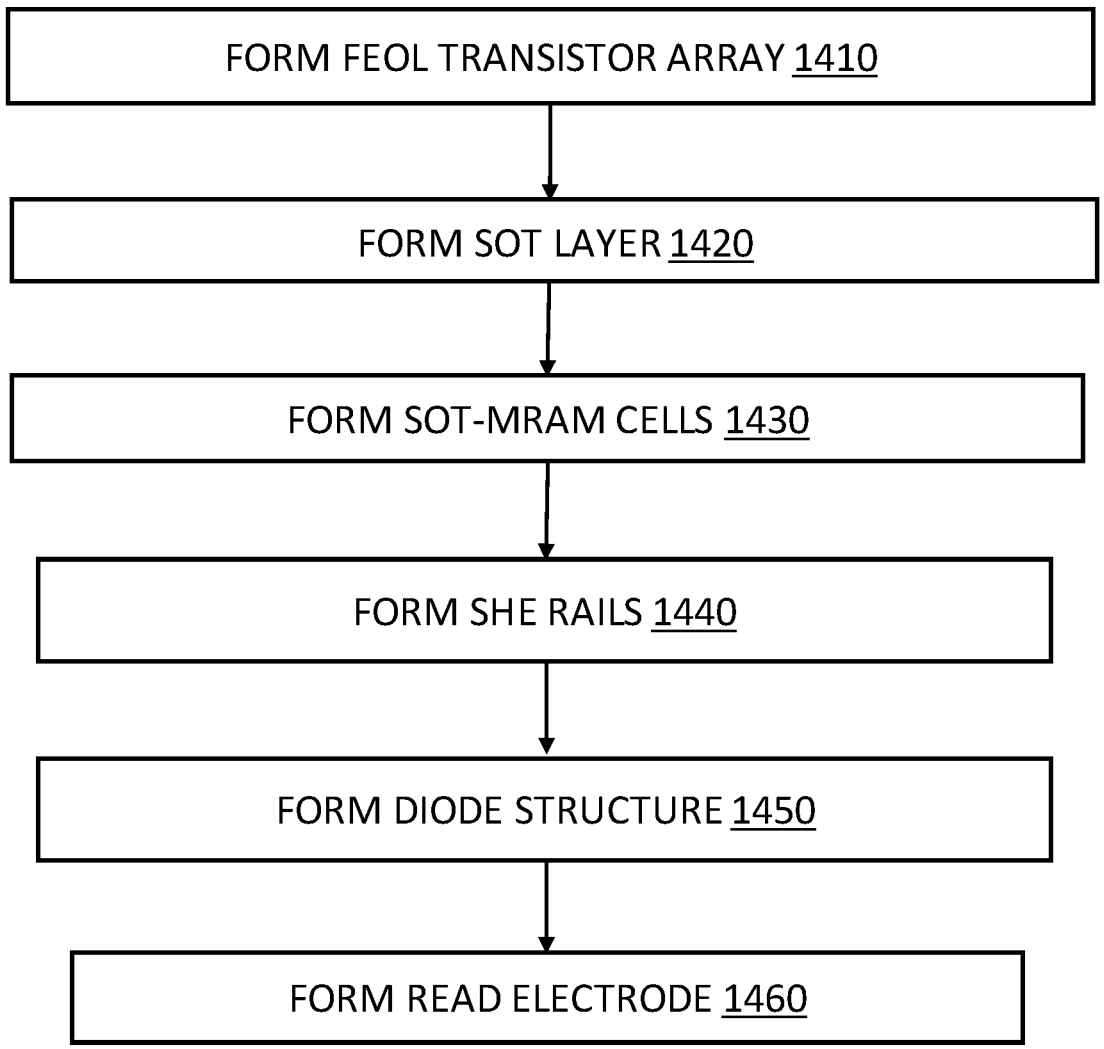
FIG. 14 a flowchart depicting operational steps for forming semiconductor device, according to an embodiment of the invention.

FIG. 14 provides a flowchart 1400 depicting operational steps associated with the fabrication of the disclosed SOT MRAM devices. According to the figure, at block 1410, an array of FEOL transistors are formed. The array includes source lines parallel to columns of the array and in contact with the sources of the transistors of the respective columns. The array also includes word lines formed parallel to rows of the array and in contact with the gates of the transistors of the respective rows.

At block 1420, a spin-Hall-Effect (SHE) layer is formed upon the underlying array of FEOL transistors, in contact with the drains of the transistors in each row of the array of transistors. The SHE layer includes a conductive metal layer deposited upon the underlying semiconductor device and selectively patterned and etched. The Underlying semiconductor device includes transistors ultimately used to control read and write operations of the SOT MRAM cells. The upper surface of the underlying semiconductor device includes exposed metal drain contacts of the respective device transistors.

At block 1430, the SOT MRAM cell stack is formed. The stack includes a succession of material layers, a free layer in contact with the SHE layer and having a switchable magnetic dipole moment, a tunneling junction layer, a reference layer having a fixed magnetic dipole moment, an upper electrode layer for the SOT-MRAM cells, and a protective hard mask material layer. Each layer is formed across the entire cross section of the device.

At block 1430 the hard mask layer is then patterned and selectively etched to form an array of hard mask portions in the pattern of the desired array of SOT-MRAM cells of the device The remaining SOT-MRAM cell stack layers are then selectively etched back leaving the SOT MRAM stack in contact with the SHE rail.

At block 1440 the SHE rails of the device are formed. The SOT-MRAM cells are encapsulated with a protective dielectric and an upper a hard mask layer is deposited, masked and selectively removed. The encapsulating dielectric and portions of the SHE layer are then etched away leaving the SHE rails disposed parallel to the rows of transistors of the underlying array and in contact with the drains of the transistors of each respective row.

At block 1450 the diode structures for the SOT-MRAM cells are formed on upper electrodes of the SOT-MRAM cells. Diode junction layers and upper diode electrode/hard mask layers are disposed upon the device, patterned, and selectively etched to yield a diode for each SOT-MRAM unit cell of the array. Diodes may have circular or square cross sections.

At block 1460 the bit line/read line for the SOT-MRAM cell is formed from a metallic layer deposited over the hard mask and upper electrode of the diode structure. The layer is patterned and selectively etched yielding upper read electrodes in contact with the upper layers of the diode stacks of the array of SOT-MRAM cells. The read electrode is encapsulated in a protective inter layer dielectric material.

Following the fabrication steps set forth above, known back-end-of line fabrication processes are completed to finish the fabrication of the final semiconductor device including the external packaging of the device.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. An MRAM (magnetoresistive random-access memory) structure comprising:
    an array of spin-orbit-torque (SOT) magnetoresistive-random-access-memory (MRAM) cells, wherein:
    a SOT-MRAM cell of the array comprises a transistor, a magnetic tunnel junction (MTJ), and a diode disposed above the MTJ, wherein the MTJ comprises a free layer, a tunnel junction layer, and a reference layer, each of the free layer, the tunnel junction layer, and the reference layer comprises a first width, the diode comprises a second width, and the second width is not equal to the first width, the diode comprises a two-dimensional diode junction material and an upper diode electrode layer comprising a sequence of W/TiO$_x$/Ni layers;
    a column of the array comprises a source line contacting a source contact of each transistor of the column, the source line disposed at a first metal layer of the MRAM structure; and
    a row of the array comprises a SOT line contacting a drain contact of each transistor of the row, the SOT line disposed at a second metal layer of the MRAM structure.

2. The MRAM structure according to claim 1, wherein the MTJ comprises a free layer adjacent to the SOT line.

3. The MRAM structure according to claim 1, wherein the MTJ disposed above the transistor.

4. The MRAM structure according to claim 1, wherein the SOT line is disposed perpendicular to the source line.

5. The MRAM structure according to claim 1, wherein the diode structure is disposed in contact with an SOT-MRAM stack upper electrode.

6. An MRAM (magnetoresistive random-access memory) structure comprising:
    an array of spin-orbit-torque (SOT) magnetoresistive-random-access-memory (MRAM) cells, wherein:
    a SOT-MRAM cell of the array comprises a magnetic tunnel junction (MTJ), a diode disposed above the MTJ, and a single transistor, wherein the MTJ comprises a free layer, a tunnel junction layer, and a reference layer, each of the free layer, the tunnel junction layer, and the reference layer comprises a first width, the diode comprises a second width, and the second width is not equal to the first width, the diode comprises a two-dimensional diode junction material and an upper diode electrode layer comprising a sequence of W/TiO$_x$/Ni layers;
    a column of the array comprises a source line contacting a source contact of each transistor of the column, wherein the source line is disposed at a first metal layer of the MRAM structure;
    the column comprises a bit line in contact with each diode of the column, wherein the bit line is disposed parallel to the source line and at a third metal layer of the MRAM structure; and
    a row of the array comprises a SOT line contacting a drain contact of each transistor of the row, the SOT line disposed at a second metal layer of the MRAM structure.

7. The MRAM structure according to claim 6, wherein the MTJ comprises a free layer adjacent to the SOT line.

8. The MRAM structure according to claim 6, wherein the diode structure comprises a circular structure.

9. The MRAM structure according to claim 6, wherein the diode structure comprises a square structure.

10. The MRAM structure according to claim 6, wherein the diode structure is disposed in contact with an SOT-MRAM stack upper electrode.

11. An MRAM (magnetoresistive random-access memory) structure comprising:

an array of spin-orbit-torque (SOT) magnetoresistive-random-access-memory (MRAM) cells, wherein:
a SOT-MRAM cell of the array comprises a magnetic tunnel junction (MTJ), a diode disposed above the MTJ, and a single transistor, wherein the MTJ comprises a free layer, a tunnel junction layer, and a reference layer, each of the free layer, the tunnel junction layer, and the reference layer comprises a first width, the diode comprises a second width, and the second width is not equal to the first width, the diode comprises a two-dimensional diode junction material and an upper diode electrode layer comprising a sequence of W/TiOx/Ni layers;
a column of the array comprises a source line contacting a source contact of each transistor of the column, the source line disposed at a first metal layer of the MRAM structure;
a row of the array comprises a SOT line contacting a drain contact of each transistor of the row, the SOT line disposed at a second metal layer of the MRAM structure; and
the row of the array comprises a word line in contact with a gate of each transistor of the row, wherein the word line is disposed perpendicular to the source line.

12. The MRAM structure according to claim 11, wherein the MTJ is disposed above the SOT line and comprises a free layer adjacent to the SOT line.

13. The MRAM structure according to claim 11, wherein the MTJ is disposed above the transistor.

14. The MRAM structure according to claim 11, wherein the SOT line is disposed perpendicular to the source line.

15. The MRAM structure according to claim 11, wherein the diode structure is disposed in contact with an SOT-MRAM stack upper electrode.

16. An MRAM (magnetoresistive random-access memory) structure comprising:
an array of spin-orbit-torque (SOT) magnetoresistive-random-access-memory (MRAM) cells, wherein:
a SOT-MRAM cell of the array comprises a magnetic tunnel junction (MTJ), a diode and a single transistor, wherein the diode is disposed above the MTJ, wherein the MTJ comprises a free layer, a tunnel junction layer, and a reference layer, each of the free layer, the tunnel junction layer, and the reference layer comprises a first width, the diode comprises a second width, and the second width is not equal to the first width, the diode comprises a two-dimensional diode junction material and an upper diode electrode layer comprising a sequence of W/TiO$_x$/Ni layers;
a column of the array comprises a source line contacting a source contact of each transistor of the column, the source line disposed at a first metal layer of the MRAM structure;
the column of the array comprises a bit line in contact with each diode of the column, the bit line disposed at a third metal layer of the MRAM structure;
a row of the array comprises a SOT line contacting a drain contact of each transistor of the row, and
the row of the array comprises a word line in contact with a gate of each transistor of the row.

17. The MRAM structure according to claim 16, wherein source line and the bit line are disposed in parallel.

18. The MRAM structure according to claim 16, wherein the SOT line is disposed perpendicular to the source line.

19. The MRAM structure according to claim 16, wherein the word line is disposed perpendicular to the source line.

20. The MRAM structure according to claim 16, wherein the source line is disposed at a first device level, the SOT line is disposed at a device second device level above the first level, and the bit line is disposed at a third device level above the second level.

21. A method of fabricating a semiconductor device, the method comprising:
forming an array of transistors, wherein:
a column of the array comprises a source line contacting a source contact of each transistor of the column;
forming a spin-orbit-torque (SOT) line contacting a drain contact of the transistors of a row of the array; and
forming an array of unit cells, each unit cell comprising a spin-orbit-torque (SOT) magnetoresistive random access memory (MRAM) cell stack disposed above and in electrical contact with the SOT line, wherein the SOT-MRAM cell stack comprises a free layer, a tunnel junction layer, and a reference layer, a diode structure above and in electrical contact with the SOT-MRAM cell stack, an upper electrode disposed above and in electrical contact with the diode structure, wherein the SOT-MRAM cell stack comprises a free layer, a tunnel junction layer, and a reference layer, each of the free layer, the tunnel junction layer, and the reference layer comprises a first width, the diode structure comprises a second width, and the second width is not equal to the first width, the diode comprises a two-dimensional diode junction material and an upper diode electrode layer comprising a sequence of W/TiO$_x$/Ni layers.

22. The method according to claim 21, wherein the free layer is disposed adjacent to the SOT line.

23. The method according to claim 21, further comprising forming a word line contacting a gate contact of each of the transistors of the row, wherein the word line is disposed parallel to the SOT line.

24. The method according to claim 21, further comprising forming a bit line disposed above and in electrical contact with the upper electrodes of the unit cells of a column, wherein the bit line is disposed parallel to the source line.

25. The method according to claim 21, further comprising forming the diode structure at process temperatures less than about 420C.

* * * * *